United States Patent
Pan et al.

(10) Patent No.: US 8,652,882 B2
(45) Date of Patent: Feb. 18, 2014

(54) CHIP PACKAGE STRUCTURE AND CHIP PACKAGING METHOD

(75) Inventors: Yu Tang Pan, Hsinchu (TW); Shih Wen Chou, Hsinchu (TW)

(73) Assignee: Chipmos Technologies Inc., Hsinchu (TW)

(*) Notice: Subject to any disclaimer, the term of this patent is extended or adjusted under 35 U.S.C. 154(b) by 157 days.

(21) Appl. No.: 13/166,998

(22) Filed: Jun. 23, 2011

(65) Prior Publication Data
US 2012/0091570 A1  Apr. 19, 2012

(30) Foreign Application Priority Data
Oct. 15, 2010  (TW) ............................. 099135167

(51) Int. Cl.
*H01L 23/44* (2006.01)
*H01L 23/48* (2006.01)

(52) U.S. Cl.
USPC ............ 438/123; 438/111; 438/112; 438/124

(58) Field of Classification Search
USPC .......... 438/111, 112, 123, 124; 257/E21.502, 257/E21.599, E29.031, E23.031
See application file for complete search history.

(56) References Cited

U.S. PATENT DOCUMENTS

| | | | |
|---|---|---|---|
| 6,075,284 A | 6/2000 | Choi et al. | |
| 6,198,171 B1 | 3/2001 | Huang et al. | |
| 6,335,227 B1 * | 1/2002 | Tsubosaki et al. | ............ 438/123 |
| 6,635,957 B2 | 10/2003 | Kwan et al. | |
| 7,217,991 B1 | 5/2007 | Davis | |
| 7,364,948 B2 * | 4/2008 | Lai et al. | ........................ 438/112 |
| 2002/0058359 A1 * | 5/2002 | Akram | .......................... 438/123 |
| 2002/0158347 A1 | 10/2002 | Yagi | |
| 2010/0072590 A1 | 3/2010 | Liu et al. | |

FOREIGN PATENT DOCUMENTS

| | | |
|---|---|---|
| JP | 2004319824 | 11/2004 |
| TW | 200406810 | 5/2004 |

OTHER PUBLICATIONS

SIPO Office Action for Application No. CN 201010547910.3 dated Aug. 19, 2013.
TIPO Office Action for Application No. TW 10220818410 dated Jun. 24, 2013.
English Translation of JP 2004319824.

(Continued)

*Primary Examiner* — Hung Vu
(74) *Attorney, Agent, or Firm* — WPAT, P.C.; Anthony King; Kay Yang

(57) ABSTRACT

A chip packaging method includes the steps of: attaching a first tape to a metal plate; patterning the metal plate to form a plurality of terminal pads and a plurality of leads, wherein the plurality of terminal pads and the plurality of leads are disposed on two opposite sides of a central void region, the plurality of terminal pads on each side are arranged in at least two rows spaced apart from each other in the direction away from the central void region, and each lead has a first end portion extending to the central void region and a second end portion connecting to a corresponding terminal pad; attaching a second tape having openings to the plurality of terminal pads, wherein each of the openings exposes the central void region and the first end portions of the leads; removing the first tape; attaching a chip to the plurality of terminal pads and the plurality of leads, wherein a plurality of bond pads on the chip are corresponding to the central void region; and connecting the bond pads to the first end portions of the leads with a plurality of bonding wires through the opening.

6 Claims, 12 Drawing Sheets

(56) References Cited

OTHER PUBLICATIONS

English Translation of Office Action of Application No. CN 201010547910.3 dated Aug. 19, 2013.

English Translation of Office Action of Application No. TW 10220818410 dated Jun. 24, 2013.
English Translation of TW 200406810.

* cited by examiner

CHIP PACKAGE STRUCTURE AND CHIP PACKAGING METHOD

BACKGROUND OF THE INVENTION

1. Field of the Invention

The present invention relates to a chip package structure and a chip packaging method, and more particularly to a multi-row flat non-leaded package structure including a chip with centrally disposed pads and a chip packaging method thereof.

2. Description of the Related Art

FIG. 1 demonstrates a conventional quad/dual flat non-leaded (QFN/DFN) chip package structure 6, which comprises a chip 61, a leadframe 62, and a plurality of bonding wires 64. The chip 61 includes a plurality of bond pads 63 disposed in the central region of the active surface of the chip 61. The leadframe 62 includes a die paddle 65 and a plurality of leads 66. The leads 66 are arranged along at least two opposite sides of the die paddle 65. The chip 61 is mounted on the die paddle 65 of the leadframe 62. The bonding wires 64 respectively connect the bond pads 63 of the chip 61 to the leads 66. Because the bond pads 63 are disposed in the central region of the active surface of the chip 61, long bonding wires 64 are needed to connect the bond pads 63 of the chip 61 to the leads 66 of the leadframe 62. However, long bonding wires 64 are unfavorable to signal transmission, and are prone to wire collapse and sweep, and an increase in packaging cost. In addition, due to the space limitations for layout, the number of leads 66 of the leadframe 62 can hardly be increased; hence, it is difficult to fulfill the requirement for high input/output (I/O) density chips.

FIGS. 2A and 2B respectively illustrate a BGA (ball grid array) package 7 and a chip stack BGA package 9. The BGA package 7 includes a chip 72 mounted on an upper surface of a substrate 71. The chip stack BGA package 9 includes chips 72 and 73, which are stacked and mounted on an upper surface of a substrate 75. Each of the substrates 71 and 75 has a central slot 76. The bond pads 77 of the chip 72 are disposed in the central region of the active surface, and are corresponding in position to the central slot 76 when the chip 72 is mounted on the substrate 71 or 75. The bonding wires 74 electrically connect the bond pads 77 of the chip 72 to the lower surface of the substrate 71 or 75 through the central slot 76. In the chip stack BGA package 9, the chip 73 is fixed onto the chip 72, and the bonding wires are then formed to electrically connect the chip 73 to the upper surface of the substrate 75. Generally, compared with leadframes, the substrates 71 and 75 of the BGA package 7 and the chip stack BGA package 9 which are printed circuit boards are more expensive, resulting in higher cost of the packages 7 and 9. In particular, the substrate 75 of the chip stack BGA package 9 should be a two-layer copper substrate, which is even more expensive. Consequently, such BGA packages suffer from a cost disadvantage in the highly competitive semiconductor industry.

Due to the drawbacks of the afore-mentioned conventional chip packages, improved new chip package structures are demanded.

SUMMARY OF THE INVENTION

One objective of the present invention is to provide a chip package structure and a method for forming the same. The chip package structure avoids use of long-span bonding wires, offers a greater number of input/output terminals, and reduces the manufacturing cost.

In accordance with the above objective, one embodiment of the present invention proposes a chip packaging method comprising the steps of: attaching a first tape to a first surface of a metal plate; patterning a second surface of the metal plate opposite the first surface to form a plurality of leadframes, each leadframe comprising a first surface and a second surface respectively corresponding to the first and second surfaces of the metal plate, a central void region, and two lead groups disposed on opposite sides of the central void region, wherein each lead group comprises a plurality of terminal pads arranged in at least two rows spaced apart from each other in a direction away from the central void region, and a plurality of leads each including a first end portion extending to the central void region and a second end portion connecting to a corresponding one of the terminal pads; attaching a second tape to the plurality of leadframes, wherein the second tape includes a plurality of openings, each opening exposing the central void region of a corresponding one of the plurality of leadframes and the first end portions of the corresponding leads; removing the first tape; attaching a first chip to each leadframe, the first chip having an active surface, a rear surface opposite the active surface, and a plurality of bond pads disposed on the active surface, wherein the active surface of the first chip is attached to the first surface of the corresponding leadframe with the bond pads corresponding to the central void region; and connecting the bond pads of each of the first chips to the second surface of the leadframe at the first end portions of the corresponding leads with a plurality of first bonding wires through the opening.

Another embodiment of the present invention proposes a chip packaging method comprising the steps of: patterning a first surface of a metal plate to form a plurality of leadframes, each leadframe comprising a recess and two lead groups disposed on opposite sides of the recess, wherein each lead group comprises a plurality of terminal pads arranged in at least two rows spaced apart from each other in a direction away from the recess, and a plurality of leads each including a first end portion adjacent to the recess and a second end portion connecting to a corresponding one of the terminal pads; forming a dielectric layer between the terminal pads and the leads, wherein the recess and the first end portions of the leads are exposed from the dielectric layer; removing a second surface of the metal plate opposite the first surface until a central void region is formed at the recess and the plurality of terminal pads and the plurality of leads are isolated from one another; attaching a first chip to each leadframe, the leadframe comprising a first surface and a second surface respectively corresponding to the first and second surfaces of the metal plate, the first chip having an active surface, a rear surface opposite the active surface, and a plurality of bond pads disposed on the active surface, wherein the active surface of the first chip is attached to the second surface of the leadframe with the bond pads corresponding to the central void region; and electrically connecting the bond pads of each of the first chips to the first surface of the leadframe at the first end portions of the corresponding leads with a plurality of first bonding wires through the central void region.

One embodiment of the present invention proposes a chip package structure, which comprises a leadframe, a first chip, a plurality of first bonding wires, and an encapsulant.

The leadframe comprises a central void region and two lead groups disposed on opposite sides of the central void region, wherein each lead group comprises a plurality of terminal pads arranged in at least two rows spaced apart from each other in a direction away from the central void region, and a plurality of leads each including a first end portion extending to the central void region and a second end portion connecting to a corresponding one of the terminal pads.

The first chip has an active surface, a rear surface opposite the active surface, and a plurality of bond pads disposed on the active surface, wherein the active surface of the first chip is attached to a first surface of the leadframe with the bond pads corresponding to the central void region.

The plurality of first bonding wires electrically connecting the bond pads of the first chip to a second surface of the leadframe opposite the first surface at the first end portions of the corresponding leads through the central void region.

The encapsulant covers the first chip, the leadframe, and the first bonding wires, wherein the encapsulant exposes bottom surfaces of the terminal pads.

Compared with the conventional chip package structure 6 with long bonding wires employed as shown in FIG. 1, the leadframe of the chip package structure of the present invention includes a central void region, through which the central bond pads of the chip are electrically connected with the leads extending to the central void region. Consequently, the lengths of the bonding wires can be significantly reduced, avoiding the issues due to long bonding wires such as signal deterioration, bonding wire collapse, bonding wire sweep, and high packaging cost. In addition, the leadframe includes multiple rows of terminal pads so that the number of input/output terminals can be increased. Furthermore, compared with the conventional BGA packages shown in FIGS. 2A and 2B, the chip package structure of the present invention uses the low-cost leadframe so that the packaging cost can be reduced.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION OF THE INVENTION

The present invention relates to a package structure of a chip with central bond pads. The chip package structure can be a multi-row quad/dual flat non-leaded (QFN/DFN) chip package structure.

Figure 1:
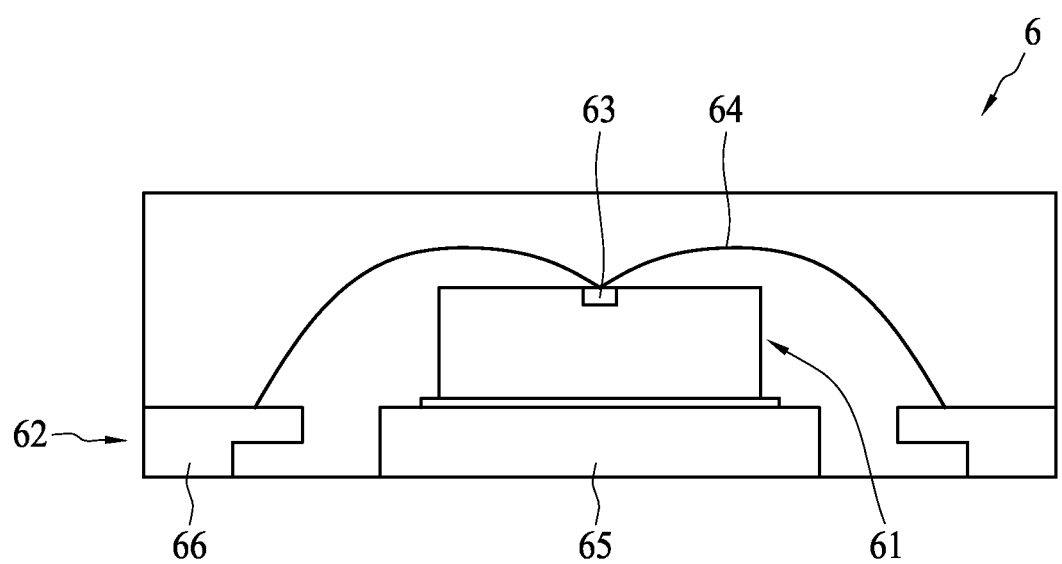
FIG. 1 demonstrates a conventional chip package structure.
Figure 2A:
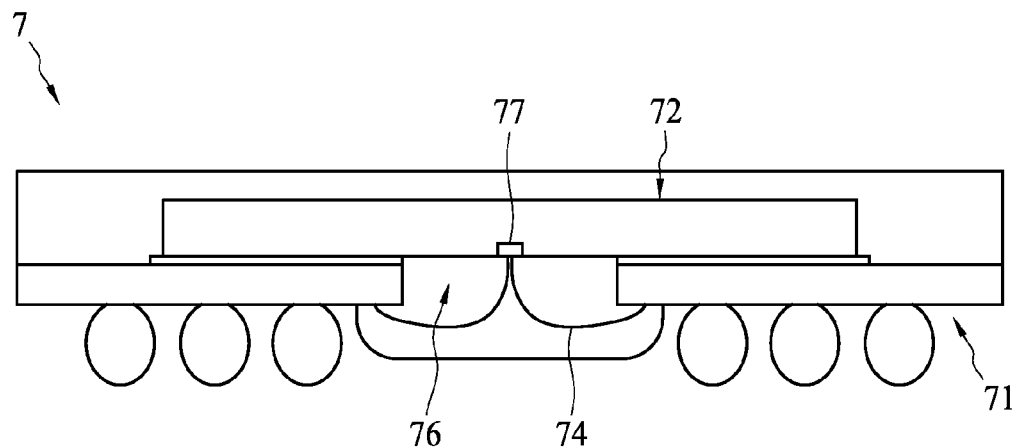
FIG. 2A illustrates a conventional BGA package.
Figure 2B:
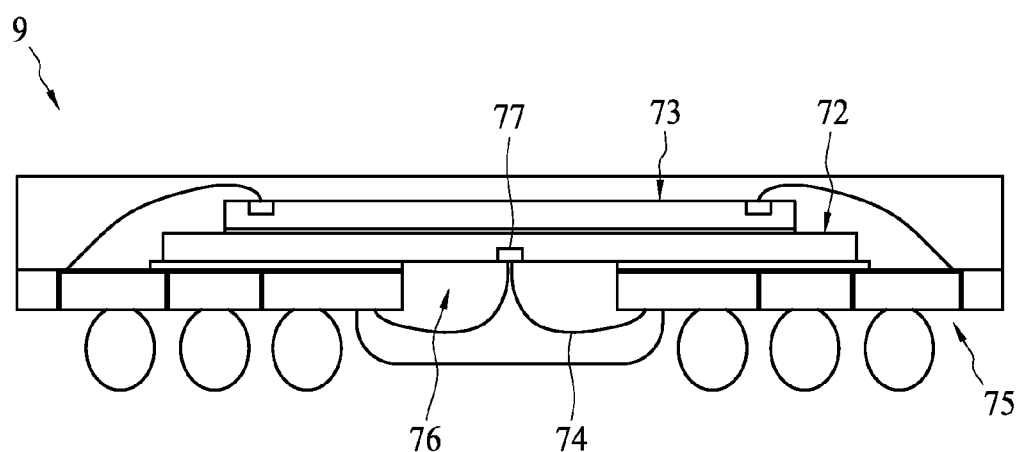
FIG. 2B illustrates a conventional chip stack BGA package.
Figure 3:
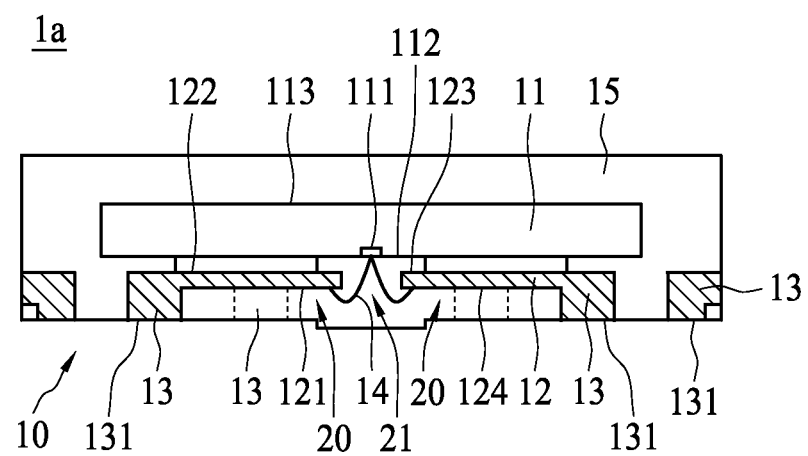
FIG. 3 is a cross-sectional view showing a chip package structure according to one embodiment of the present invention.
Figure 4:
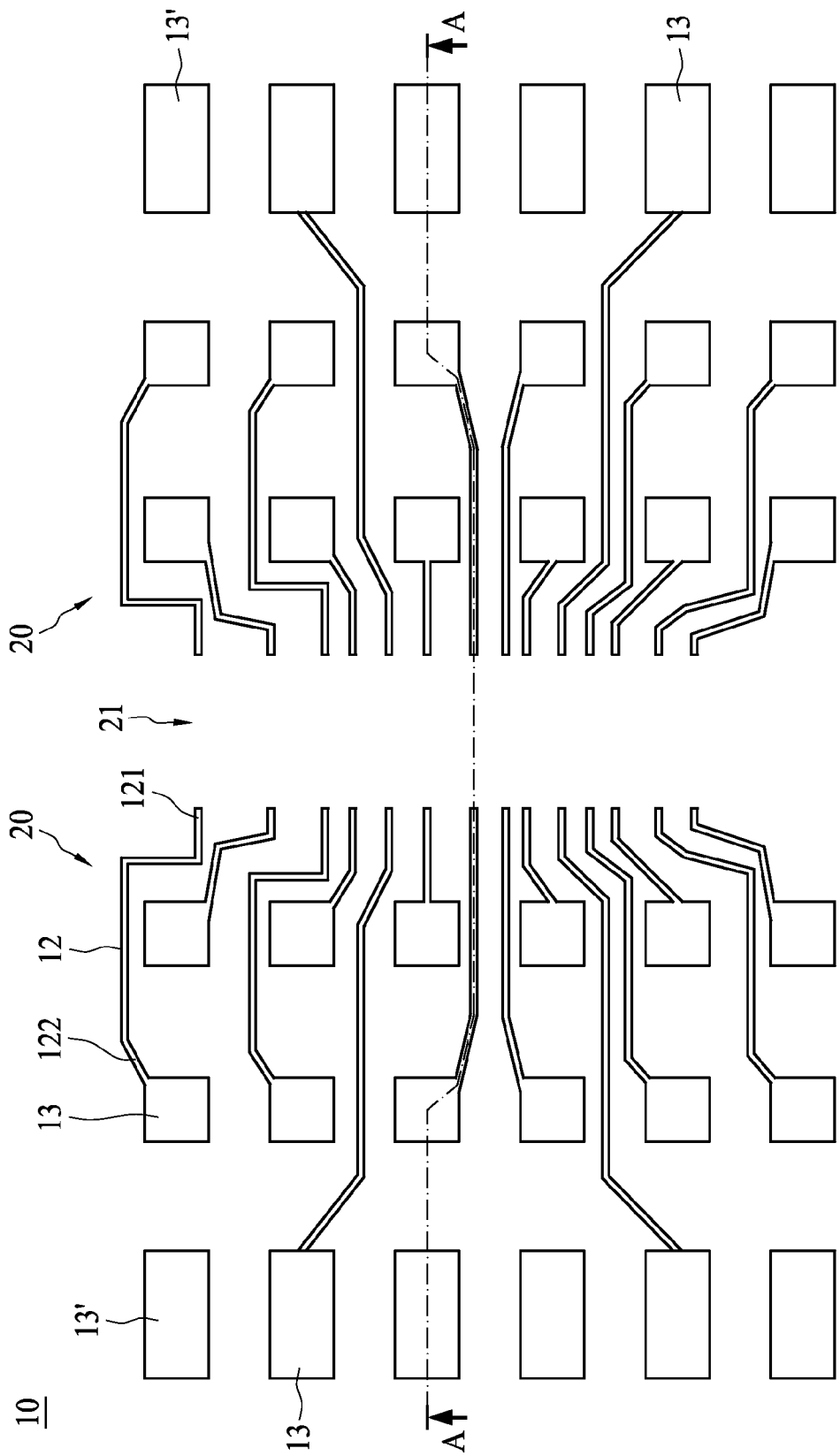
FIG. 4 is a schematic view showing a leadframe according to one embodiment of the present invention.

FIG. 3 is a cross-sectional view showing a chip package structure 1a according to an embodiment of the present invention. FIG. 4 is a plan view showing a leadframe 10 according to an embodiment of the present invention. Referring to FIGS. 3 and 4, the chip package structure 1a comprises a leadframe 10, a first chip 11, a plurality of first bonding wires 14, and an encapsulant 15.

Referring to FIG. 4, the leadframe 10 comprises a central void region 21 and two lead groups 20 disposed on two opposite sides of the central void region 21. Each lead group 20 comprises a plurality of terminal pads 13 and 13' and a plurality of leads 12. The plurality of terminal pads 13 and 13' of each lead group 20 are arranged in a multi-row array of at least two rows. The at least two rows of the terminal pads 13 are spaced apart from each other in the direction away from the central void region 21. Each lead 12 includes a first end portion 121 and an opposite second end portion 122, wherein the first end portion 121 extends to the central void region 21, and the second end portion 122 connects with a corresponding terminal pad 13. In the present embodiment, the plurality of terminal pads 13 and 13' of each lead group 20 are arranged in three rows, wherein the terminal pads 13 connect with the second end portions 122 of the corresponding leads 12, and the terminal pads 13' are isolated without connecting with the leads 12, and most of the terminal pads 13' are disposed in the row most distant from the central void region 21. However, the terminal pads 13' without connecting with the leads 12 can be arranged in any row of the terminal pads.

Referring to FIG. 3, the first chip 11 has an active surface 112, a rear surface 113 opposite the active surface 112, and a plurality of bond pads 111 disposed on the active surface 112. The first chip 11 is bonded to the leadframe 10 with its active surface 112 attached to the first surface 123 of the leadframe 10 and the bond pads 111 corresponding in position to the central void region 21.

The plurality of first bonding wires 14 respectively connect the bond pads 111 on the active surface 112 to the first end portions 121 of the leads 12. In particular, the bond pads 111 are disposed in a central region of the active surface 112 of the first chip 11. Each first bonding wire 14 connects with a corresponding bond pad 111, passes through the central void region 21, and connects to the second surface 124 opposite to the first surface 123 at the first end portion 121 of the corresponding lead 12.

An encapsulant 15 covers the first chip 11, the leadframe 10, and the plurality of first bonding wires 14 while the bottom surfaces 131 of the plurality of terminal pads 13 are exposed from the encapsulant 15 for external electrical connections.

Figure 5:
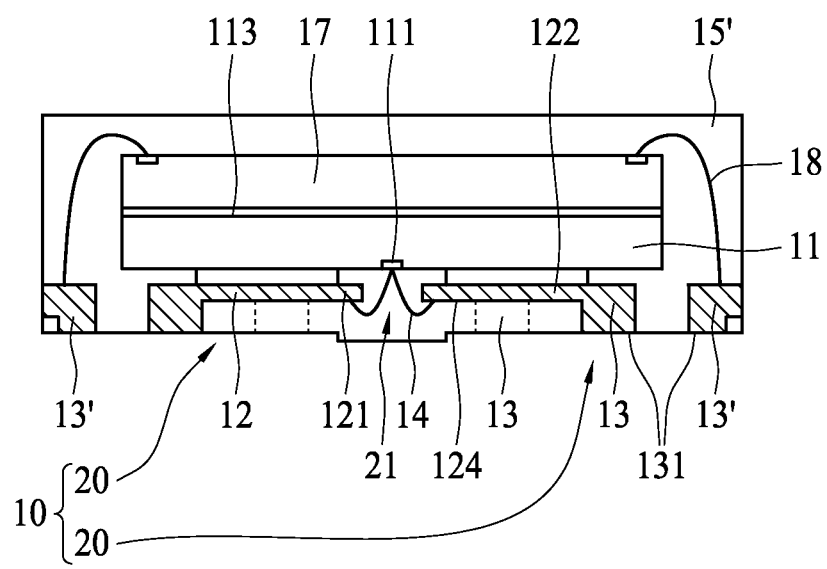
FIG. 5 is a cross-sectional view showing a chip package structure according to another embodiment of the present invention.

Referring to FIGS. 4 and 5, the chip package structure 1b comprises a first chip 11, a second chip 17, a leadframe 10, a plurality of first bonding wires 14, a plurality of second bonding wires 18, and an encapsulant 15'.

The leadframe 10 comprises two lead groups 20 separately disposed on two opposite sides of the central void region 21. Each lead group 20 comprises a plurality of leads 12 and a plurality of terminal pads 13 and 13'. The terminal pads 13 connect with the leads 12 while the terminal pads 13' are isolated without connecting with the leads 12. The terminal pads 13 and 13' of each lead group 20 are arranged into at least two rows, which are spaced apart from each other in the direction away from the central void region 21. In the present embodiment, the terminal pads 13 and 13' of each lead group 20 are arranged into three rows, wherein the terminal pads 13' which are not connecting with the leads 12 are disposed in the row that are most distant from the central void region 21. In other embodiments, the terminal pads 13 and 13' of each lead group 20 can be arranged into more than three rows.

The first chip 11 comprises a plurality of bond pads 111 disposed in the central region of the active surface. The first chip 11 is attached to the first surface 123 of the leadframe 10 so that the plurality of bond pads 111 face and correspond in position to the central void region 21.

Each first bonding wire 14 connects to the second surface 124 opposite to the first surface 123 at the first end portion 121 of the corresponding lead 12, passes through the central void region 21, and connects with a corresponding bond pad 111.

The second chip 17 is bonded to the rear surface 113 of the first chip 11. The second bonding wires 18 electrically connect the second chip 17 to the first surface 123 of the leadframe 10 at the plurality of terminal pads 13' which are not connecting with the leads 12.

The encapsulant 15' covers the first chip 11, the leadframe 10, the second chip 17, the plurality of first bonding wires 14, and the plurality of second bonding wires 18 while the bottom surfaces 131 of the plurality of terminal pads 13 and 13' are exposed from the encapsulant 15' for external electrical connections, such as surface mounting to a PCB.

Figure 8:
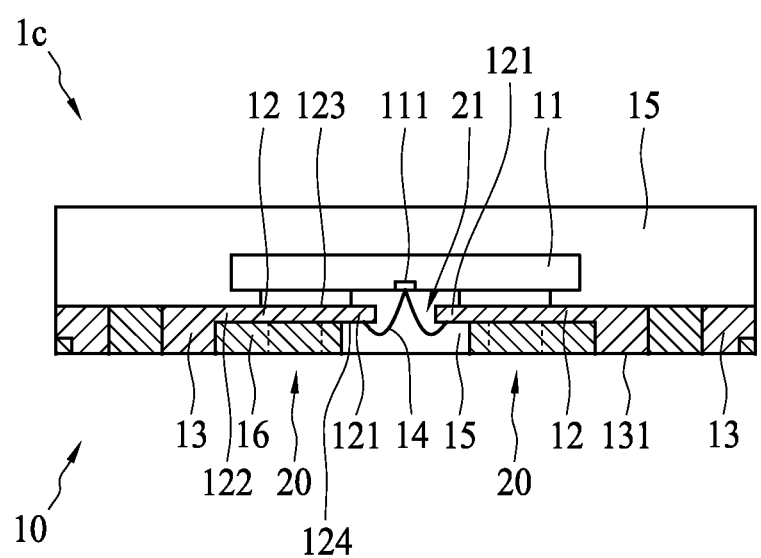
FIG. 8 is a cross-sectional view showing a chip package structure according to another embodiment of the present invention.

Referring to FIG. 8, the chip package structure 1c comprises a first chip 11, a leadframe 10, a plurality of first bonding wires 14, an encapsulant 15, and a dielectric layer 16. The leadframe 10 comprises a central void region 21 and two lead groups 20 disposed on two opposite sides of the central void region 21. Each lead group 20 comprises a plurality of leads 12 and a plurality of terminal pads 13 connected with the second end portions 122 of the leads 12. The first chip 11 comprises a plurality of bond pads 111 disposed in the central region of the active surface. The first chip 11 is attached to the first surface 123 of the leadframe 10 with the plurality of bond pads 111 facing and corresponding in position to the central void region 21. The first bonding wire 14 connects to the second surface 124 opposite to the first surface 123 at the first end portion 121 of a corresponding lead 12, passes through the central void region 21 and connects with a corresponding bond pad 111. The dielectric layer 16 is formed between the terminal pads 13 and the leads 12 for securely binding the terminal pads 13 and the leads 12. The dielectric layer 16 can have a thickness equal to the thickness of the leads 12, to the thickness of the terminal pads 13, or lying in between the thicknesses of the terminal pads 13 and the leads 12. Clearly, the dielectric layer 16 with larger thickness provides better bonding effect. For the dielectric layer 16 comprising low moisture absorbing material, larger thickness can even provide better resistance to moisture invasion. The material of the dielectric layer 16 can be selected from the group including a thermally conductive paste, a solder mask/resist, polyimide, benzocyclobutene, and the like.

FIGS. 6A to 6G are cross-sectional views showing the processes of a chip packaging method according to one embodiment of the present invention.

Figure 6A:
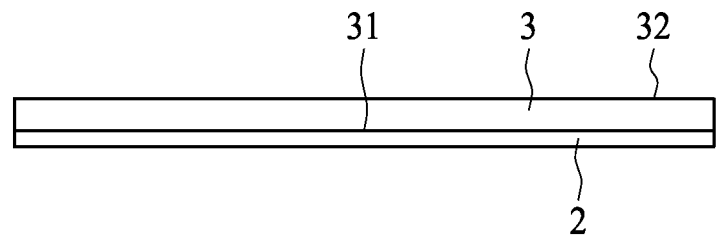
FIGS. 6A to 6G are cross-sectional views showing the processes of a chip packaging method according to one embodiment of the present invention.

As shown in FIG. 6A, a first tape 2 and a metal plate 3 are provided, wherein the metal plate 3 comprises a first surface 31 and a second surface 32 opposite the first surface 31. The first tape 2 is attached to the first surface 31 of the metal plate 3.

Figure 6B:
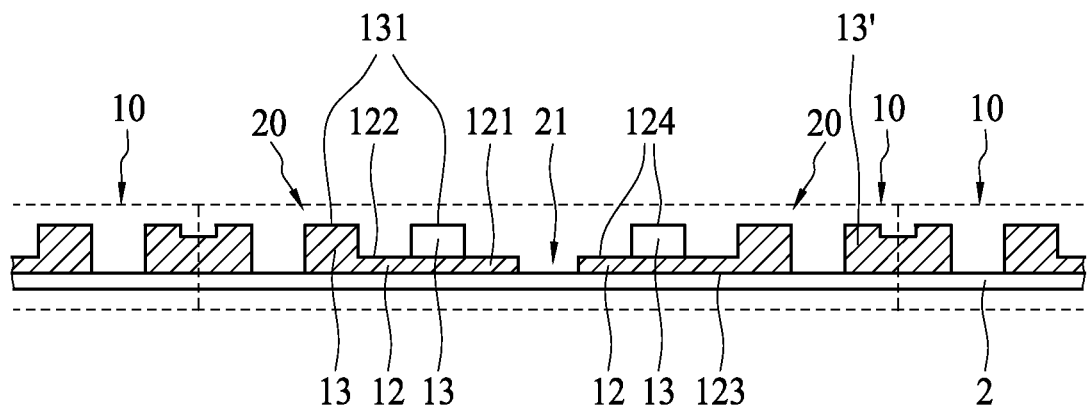

As shown in FIG. 6B, the second surface 32 of the metal plate 3 is patterned to form a plurality of leadframes 10. Each leadframe 10 comprises a central void region 21 and two lead groups 20 disposed on two opposite sides of the central void region 21. Each lead group 20 comprises a plurality of terminal pads 13 and 13' and a plurality of leads 12, wherein the plurality of terminal pads 13 and 13' of each lead group 20 can be arranged in a multi-row array of at least two rows. The at least two rows of the terminal pads 13 and 13' are spaced apart from each other in the direction away from the central void region 21. In the present embodiment, the terminal pads 13 and 13' of each lead group 20 are arranged in three rows. Each lead 12 comprises a first end portion 121 and a second end portion 122, wherein the first end portion 121 extends to the central void region 21, and the second end portion 122 connects with a corresponding terminal pad 13. The terminal pads 13' are isolated without connecting with the leads 12 and most of the terminal pads 13' are disposed in the row most distant from the central void region 21. In the present embodiment, the step of patterning the metal plate 3 can be performed by an etching process, wherein the leads 12 are formed by removing a portion of the metal plate 3 with a half-etching process.

Figure 6C:
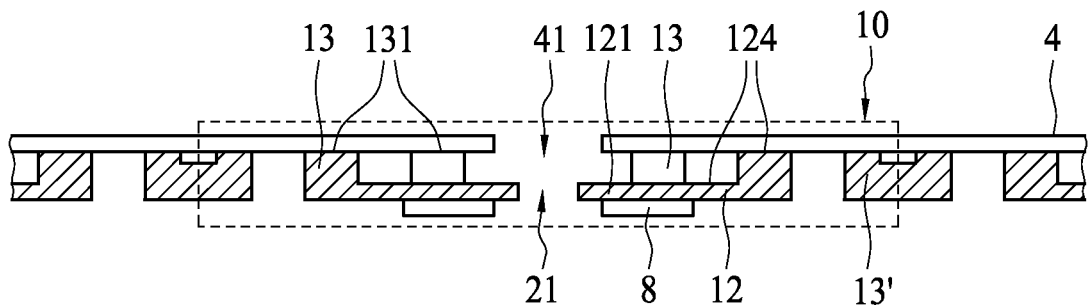
Figure 6D:
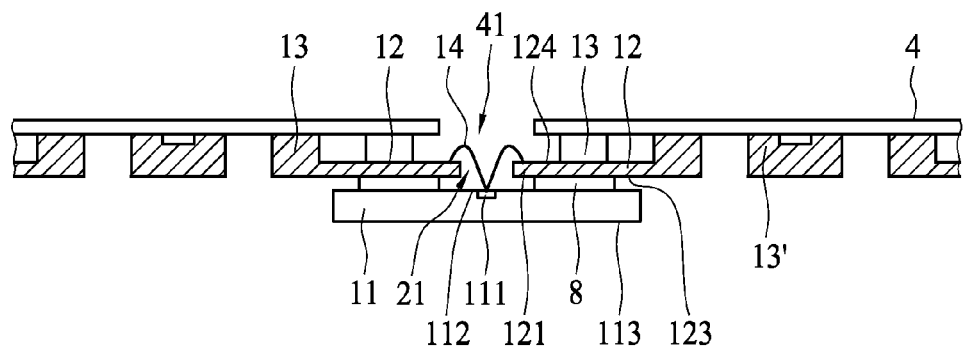

Referring to FIG. 6C, a second tape 4 is attached to the second surfaces 124 of the leadframes 10, which are the surfaces of the leadframes 10 formed after patterning the second surface 32 of the metal plate 3. Specifically, the second tape 4 is attached to the bottom surfaces 131 of the terminal pads 13 and 13' of the leadframes 10. The second tape 4 comprises a plurality of openings 41, wherein each opening 41 exposes the central void region 21 of each leadframe 10 and the first end portions 121 of the leads 12. Thereafter, the first tape 2 is removed. Next, a die attach layer 8 is formed on the first surface 123 of the leadframe 10 (i.e. the first surface 31 of the metal plate 3).

Referring to 6D, the first chip 11 is attached to the corresponding leadframe 10 by the die attach layer 8. The first chip 11 comprises an active surface 112, a rear surface 113 opposite the active surface, and a plurality of bond pads 111 disposed on the active surface 112. The first chip 11 is bonded to the leadframe 10 with its active surface 112 attached to the first surface 123 of the leadframe 10 and the plurality of bond pads 111 corresponding in position to the central void region 21 of the leadframe 10.

After the first chip 11 is bonded, a plurality of bonding wires 14 are formed to electrically connect the bond pads 111 to the first end portions 121 of the leads 12 of the leadframe 10 respectively through the opening 41, wherein each bonding wire 14 connects with a corresponding bond pad 111, passes through the central void region 21 and connects to the second surface 124 of the leadframe 10 at the first end portion 121 of the corresponding lead 12.

Figure 6E:
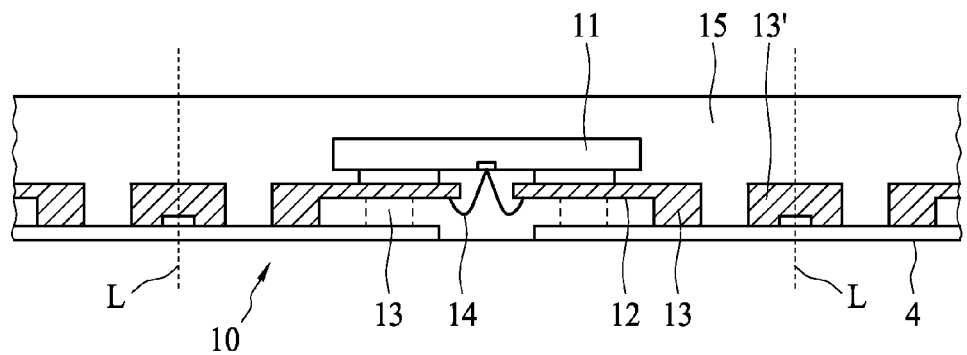
Figure 6F:
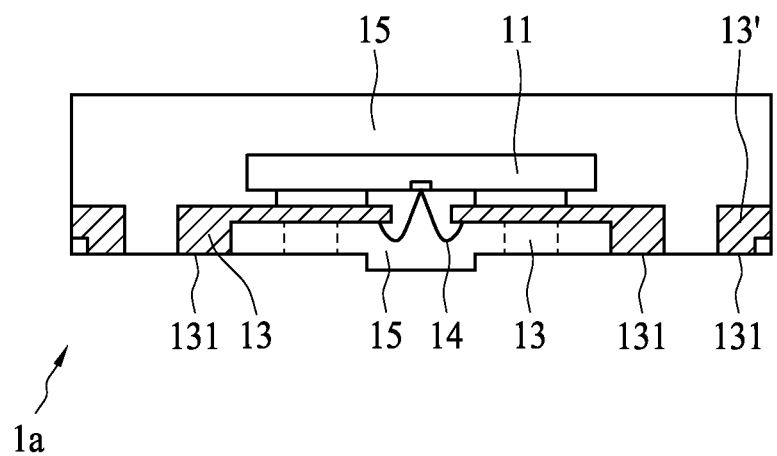

Referring to FIGS. 6E and 6F, after the wire-bonding process is completed, an encapsulant 15 is formed to cover the first chips 11, the leadframes 10 and the first bonding wires 14. Subsequently, the encapsulant 15 and the leadframes 10 are singulated along the dashed lines L shown in FIG. 6E to form a plurality of individual chip package structures 1a, wherein the singulating process can be performed by, for example, a dicing or sawing method. Finally, the second tape 4 is removed. Consequently, the bottom surfaces 131 of the terminal pads 13 and 13' of the chip package structure 1a are exposed from the encapsulant 15 so as to be used for external electrical connections.

Figure 6G:
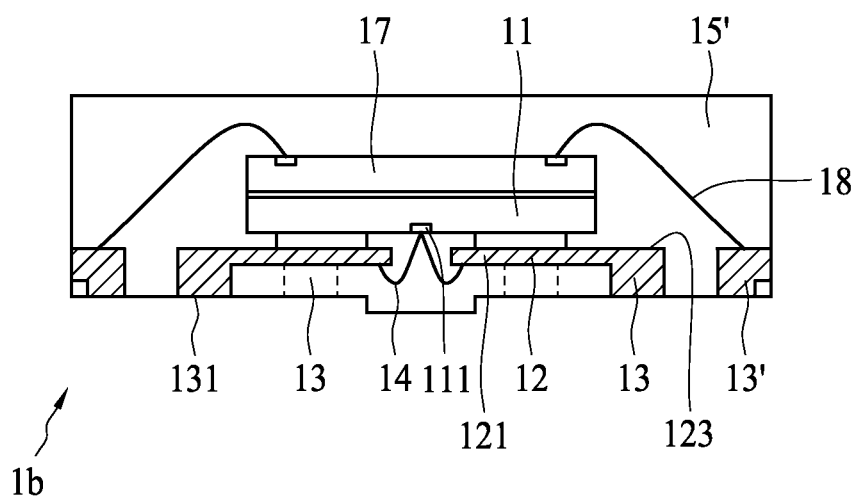

Referring to FIG. 6G, before the structure illustrated in FIG. 6E is formed, a second chip 17 can be bonded to the rear surface 113 of the first chip 11 in a back to back manner after the first chip 11 is mounted on the leadframe 10. Next, a plurality of first bonding wires 14 are formed to respectively connect the bond pads 111 to the first end portions 121 of the leads 12 of the leadframe 10 through the opening 41, and a plurality of second bonding wires 18 are formed to electrically connect the second chip 17 to the terminal pads 13' on the first surface 123 of the leadframe 10. In another embodiment, the second chip 17 can be bonded onto the first chip 11 after the first bonding wires 14 connect the bond pads 111 of the first chip 11 to the first end portions 121 of the leads 12. The second bonding wires 18 are then formed for electrically connecting the second chip 17 to the terminal pads 13'. Thereafter, an encapsulant 15' is formed to cover the first chips 11, the second chips 17, the leadframes 10, the first bonding wires 14, and the second bonding wires 18. Next, a singulating process is performed to form a plurality of chip package structures 1b. Finally, the second tape 4 is removed. Consequently, the bottom surfaces 131 of the terminal pads 13 and 13' are exposed from the encapsulant 15' for external electrical connections.

FIGS. 7A to 7G are cross-sectional views showing the processes of a chip packaging method according to another embodiment of the present invention.

Figure 7A:
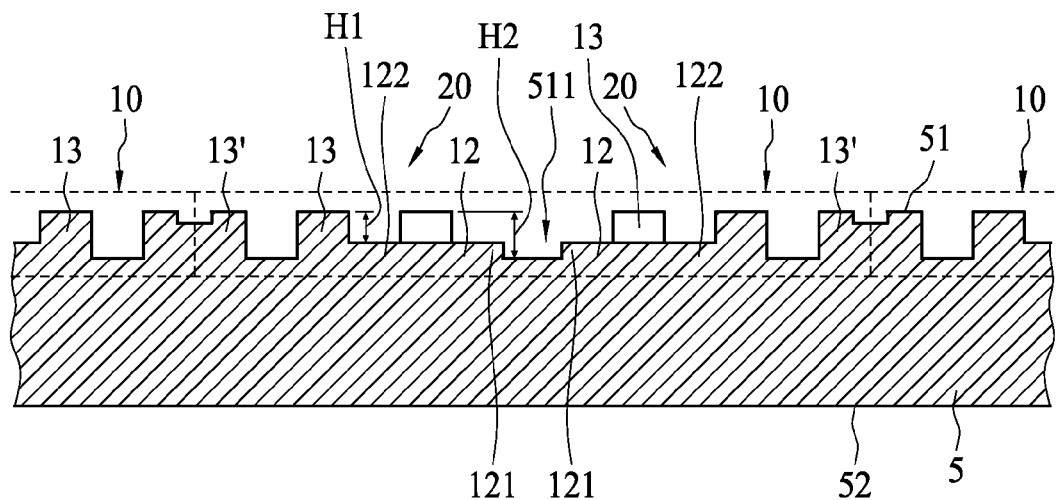
FIGS. 7A to 7G are cross-sectional views showing the processes of a chip packaging method according to another embodiment of the present invention.

Referring to FIG. 7A, a metal plate 5 is provided, wherein the metal plate 5 comprises a first surface 51 and a second surface 52 opposite the first surface 51. Next, the first surface 51 of the metal plate 5 is patterned to form a plurality of leadframes 10, wherein each leadframe 10 comprises a recess 511 and two lead groups 20 on two opposite sides of the recess 511. Each lead group 20 comprises a plurality of terminal pads 13 and 13' and a plurality of leads 12, wherein the plurality of terminal pads 13 and 13' are arranged in a multi-row array of at least two rows. The at least two rows of the terminal pads 13 and 13' are spaced apart from each other in the direction away from the recess 511. In the present embodiment, the terminal pads 13 and 13' of each lead group 20 are arranged in three rows. Each lead 12 comprises a first end portion 121 and a second end portion 122, wherein the first end portion 121 is adjacent to the recess 511, and the second end portion 122 connects with a corresponding terminal pad 13. In one embodiment, the patterning of the metal plate 5 comprises partially removing the metal plate 5 at the regions other than the terminal pads 13 and 13' to a first thickness H1, and partially removing the metal plate 5 at the regions other than the terminal pads 13 and 13' and the leads 12 to a second thickness H2 so as to form the leads 12 and the recess 511, wherein the second thickness H2 is greater than the first thickness H1.

Figure 7B:
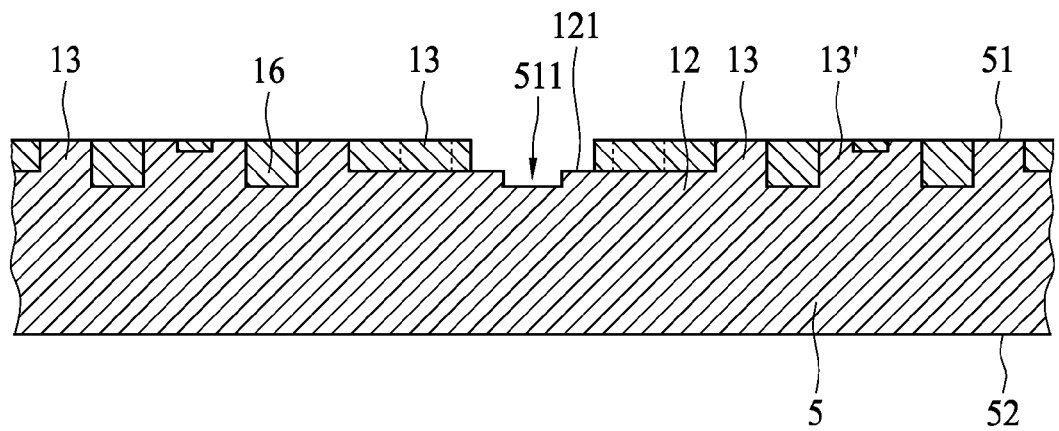

Referring to FIG. 7B, a dielectric layer 16 is formed between the terminal pads 13 and 13' and the leads 12 for fastening, wherein the recess 511 and the first end portions 121 of the leads 12 are exposed from the dielectric layer 16. The dielectric layer 16 can have a thickness equal to the thickness of the leads 12, to the thickness of the terminal pads 13, or lying in between the thicknesses of the terminal pads 13 and the leads 12. Clearly, the dielectric layer 16 with larger thickness provides better bonding effect. For the dielectric layer 16 comprising low moisture absorbing material, larger thickness can even provide better resistance to moisture invasion. The material of the dielectric layer 16 can be selected from the group including a thermally conductive paste, a solder mask/resist, polyimide, benzocyclobutene, and the like.

Figure 7C:
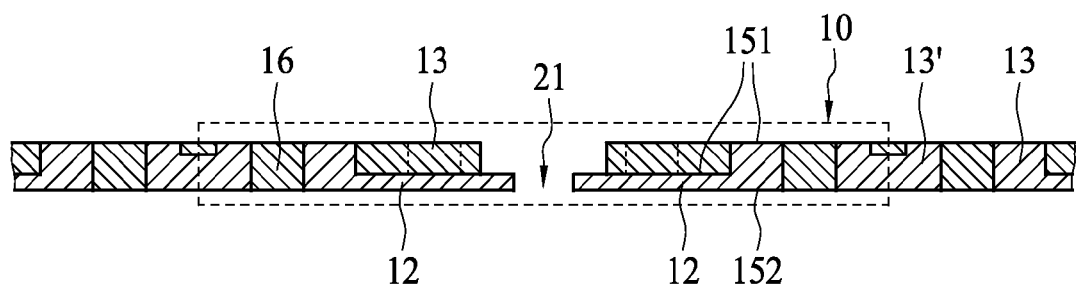

Referring to FIGS. 7B and 7C, the second surface 52 of the metal plate 5 is removed until a penetrating central void region 21 is formed at the recess 511, and the terminal pads 13 and 13' and the leads 12 are isolated from one another.

Figure 7D:
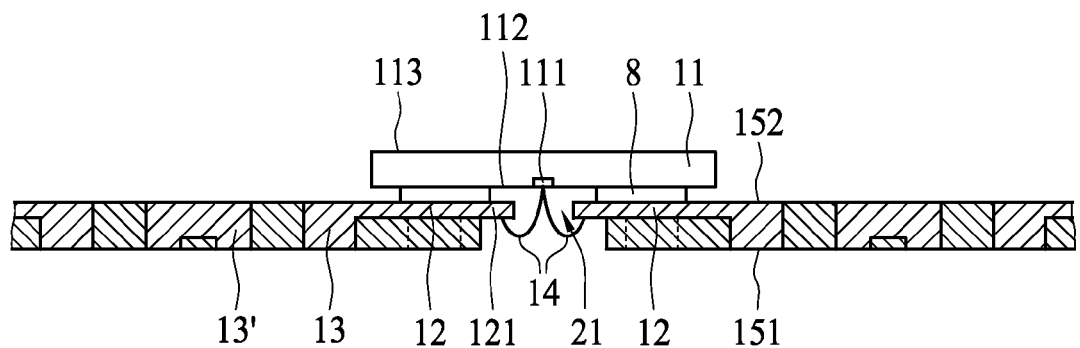

Referring to FIG. 7D, a die attach layer 8 is then formed on the second surfaces 152 of the leadframes 10 (i.e., the second surface 52 of the metal plate 5). First chips 11 are bonded to the corresponding leadframes 10 by the die attach layer 8. The first chip 11 comprises an active surface 112, a rear surface 113 opposite the active surface 112, and a plurality of bond pads 111, wherein the bond pads 111 are disposed in the central region of the active surface 112 of the first chip 11. The first chip 11 is attached to the leadframe 10 with the active surface 112 of the first chip 11 facing the second surface 152 of the leadframe 10 and the bond pads 111 corresponding in position to the central void region 21 of the leadframe 10.

Next, a plurality of bonding wires 14 are formed to respectively connect the bond pads 111 to the first end portions 121 of the leads 12 through the central void region 21, wherein each bonding wire 14 connects with a corresponding bond pad 111, passes through the central void region 21, and connects to the first surface 151 of the leadframe 10 (i.e., the surface of the leadframe 10 formed after patterning the first surface 51 of the metal plate 5) at the first end portion 121 of the corresponding lead 12.

Figure 7E:
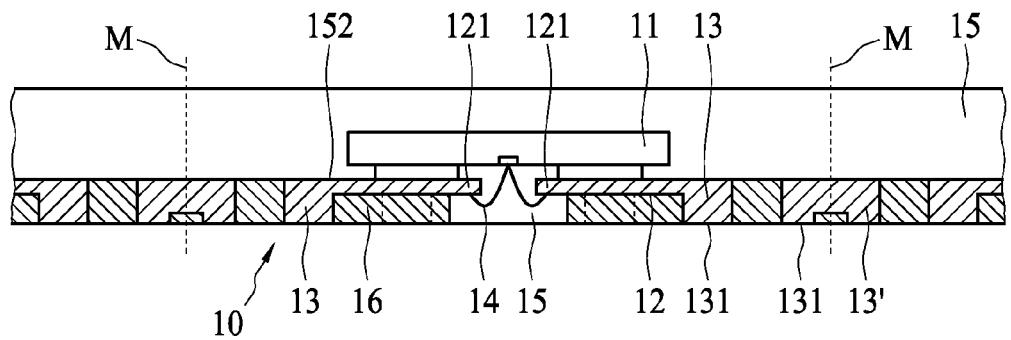

Referring to FIG. 7E, an encapsulant 15 is then formed to cover the first chips 11, the leadframes 10, and the first bonding wires 14 while the bottom surfaces 131 of the terminal pads 13 and 13' are exposed for external electrical connections.

Figure 7F:
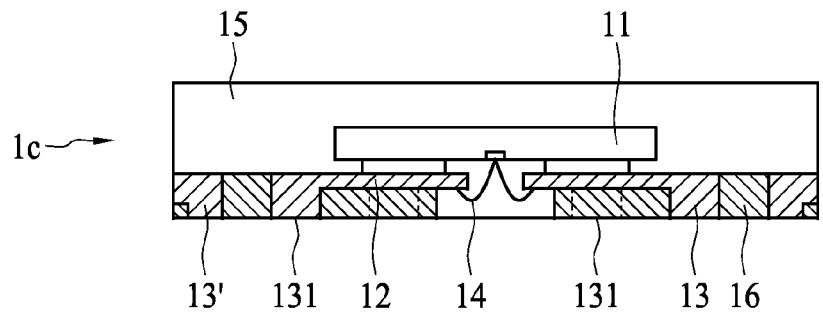

Referring to FIGS. 7E and 7F, after the encapsulant 15 is formed, the encapsulant 15 and the leadframes 10 are singulated along the dashed lines M shown in FIG. 7E so as to form a plurality of individual chip package structures 1c, wherein the singulating process can be performed by, for example, a dicing or sawing method.

Figure 7G:
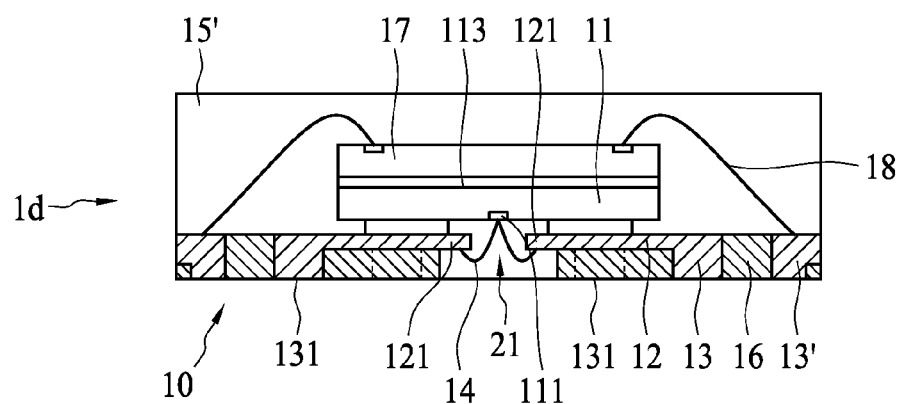

As shown in FIG. 7G, before the structure illustrated in FIG. 7E is formed, a second chip 17 can be bonded to the rear surface 113 of the first chip 11 in a back to back manner after the first chip 11 is mounted on the leadframe 10. Next, a plurality of first bonding wires 14 are formed to respectively connect the bond pads 111 to the first end portions 121 of the leads 12 of the leadframe 10 through the central void region 21, and a plurality of second bonding wires 18 are formed to electrically connect the second chip 17 to the terminal pads 13' of the leadframe 10, wherein the second bonding wires 18 are connecting to the second surface 152 of the leadframe 10. In another embodiment, the second chip 17 can be bonded onto the first chip 11 after the first bonding wires 14 connect the bond pads 111 of the first chip 11 to the first end portions 121 of the leads 12. The second bonding wires 18 are then formed for electrically connecting the second chip 17 to the terminal pads 13'. An encapsulant 15' is then formed to cover the first chips 11, the second chips 17, the leadframes 10, the first bonding wires 14, and the second bonding wires 18. Finally, a singulating process is performed to form a plurality of chip package structures 1d.

In summary, the present invention discloses a chip package structure and a method for forming the same. The chip package structure comprises a chip, a plurality of terminal pads, and a plurality of leads. The chip includes a plurality of bond pads disposed in a central region of the active surface of the chip. The terminal pads serve as the external electrical connection points of the chip package structure. Each lead connects with corresponding terminal pad at one end, and the other end of the lead extends to approach the bond pads so that the lengths of the bonding wires connecting the bond pads of the chip and the leads can be reduced.

The above-described embodiments of the present invention are intended to be illustrative only. Numerous alternative embodiments may be devised by persons skilled in the art without departing from the scope of the following claims.

What is claimed is:

1. A chip packaging method, comprising the steps of:
    patterning a first surface of a metal plate to form a plurality of leadframes, each leadframe comprising a recess and two lead groups disposed on opposite sides of the recess, wherein each lead group comprises a plurality of terminal pads arranged in at least two rows spaced apart from each other in a direction away from the recess, and a plurality of leads each including a first end portion adjacent to the recess and a second end portion connecting to a corresponding one of the terminal pads;

forming a dielectric layer between the terminal pads and the leads, wherein the recess and the first end portions of the leads are exposed from the dielectric layer;

removing a second surface of the metal plate opposite to the first surface until a central void region is formed at the recess and the plurality of terminal pads and the plurality of leads are isolated from one another;

attaching a first chip to one of the plurality of leadframes, the leadframe comprising a first surface and a second surface respectively corresponding to the first and second surfaces of the metal plate, the first chip having an active surface, a rear surface opposite the active surface, and a plurality of bond pads disposed on the active surface, wherein the active surface of the first chip is attached to the second surface of the leadframe with the bond pads corresponding to the central void region; and electrically connecting the bond pads of each of the first chips to the first surface of the leadframe at the first end portions of the corresponding leads with a plurality of first bonding wires through the central void region.

2. The chip packaging method of claim 1, wherein the step of patterning the first surface of the metal plate comprises the steps of:

partially removing the metal plate at regions other than the terminal pads to a first thickness; and partially removing the metal plate at regions other than the terminal pads and the leads to a second thickness to form the recess and the leads, wherein the second thickness is greater than the first thickness.

3. The chip packaging method of claim 1, further comprising a step of forming an encapsulant covering the first chips, the leadframes, and the first bonding wires, wherein the encapsulant exposes bottom surfaces of the terminal pads.

4. The chip packaging method of claim 3, after the step of forming the encapsulant, further comprising a step of singulating the encapsulant and the leadframes to form a plurality of chip package structures.

5. The chip packaging method of claim 1, further comprising the steps of:

attaching a second chip to the rear surface of each of the first chips;

electrically connecting the second chip to the second surface of the corresponding leadframe at the terminal pads with a plurality of second bonding wires; and forming an encapsulant covering the first chips, the second chips, the leadframes, the first bonding wires, and the second bonding wires, wherein the encapsulant exposes bottom surfaces of the terminal pads.

6. The chip packaging method of claim 5, after the step of forming the encapsulant, further comprising a step of singulating the encapsulant and the leadframes to form a plurality of chip package structures.

* * * * *